(12) United States Patent
Froissart

(10) Patent No.: US 12,339,323 B2
(45) Date of Patent: Jun. 24, 2025

(54) SYSTEMS AND METHODS FOR ALERTING FOR A LOW BATTERY STATE OF CHARGE FOR AUTONOMOUS PARCEL LOCKERS

(71) Applicant: QUADIENT TECHNOLOGIES FRANCE, Bagneux (FR)

(72) Inventor: Nicolas Froissart, Villepinte (FR)

(73) Assignee: QUADIENT TECHNOLOGIES FRANCE, Bagneux (FR)

( * ) Notice: Subject to any disclaimer, the term of this patent is extended or adjusted under 35 U.S.C. 154(b) by 452 days.

(21) Appl. No.: 17/534,862

(22) Filed: Nov. 24, 2021

(65) Prior Publication Data
US 2022/0170989 A1 Jun. 2, 2022

(30) Foreign Application Priority Data
Nov. 30, 2020 (EP) .................................... 20210547

(51) Int. Cl.
*G01R 31/371* (2019.01)
*E05B 47/00* (2006.01)
*H02J 7/00* (2006.01)

(52) U.S. Cl.
CPC ........ *G01R 31/371* (2019.01); *E05B 47/0012* (2013.01); *H02J 7/0048* (2020.01);
(Continued)

(58) Field of Classification Search
CPC .. G01R 31/36; G01R 31/364; G01R 31/3647; G01R 31/371; G01R 31/378;
(Continued)

(56) References Cited

U.S. PATENT DOCUMENTS

| 9,019,067 | B2 | 4/2015 | Bryla et al. |
| 2006/0244415 | A1* | 11/2006 | Denison .................. H02J 7/342 |
| | | | 292/201 |
| 2007/0279014 | A1* | 12/2007 | Wadle ....................... H02J 7/32 |
| | | | 322/2 R |
| 2009/0321466 | A1* | 12/2009 | Shannon ............. E05B 47/0012 |
| | | | 221/12 |

(Continued)

FOREIGN PATENT DOCUMENTS

| EP | 3671665 A1 | 6/2020 |
| EP | 3671666 A1 | 6/2020 |

(Continued)

OTHER PUBLICATIONS

European Search Report for EP 20210547.4, mailed May 21, 2021, 9 pages.

*Primary Examiner* — Son T Le
*Assistant Examiner* — Matthew W. Baca
(74) *Attorney, Agent, or Firm* — Cozen O'Connor

(57) ABSTRACT

Methods and system for alerting for a low battery state of charge for an autonomous compartments cluster interacting locally with a mobile device via a short distance wireless communication, the autonomous compartments cluster comprising: at least one compartment equipped with a door and an actuator for unlocking the door, a locker module controlling the actuator, and a battery pack powering the locker module and the at least one compartment, characterized in that the locker module comprises a voltage comparator comparing an output voltage provided at the terminal of the battery pack with a reference minimal voltage wherein the voltage comparator is configured to trigger an alert signal for replacing the battery pack when a minimum transitory voltage at the terminals of the battery pack resulting from an energizing of the actuator by a first step-up converter during an unlocking initiation of the door is lower than the reference minimal voltage, and wherein a controller is configured to change a battery status stored in a memory of the locker module from a usable battery status to a low battery status.

19 Claims, 5 Drawing Sheets

(52) U.S. Cl.
CPC ............... *E05B 2047/0065* (2013.01); *E05B 2047/0067* (2013.01)

(58) Field of Classification Search
CPC .. G01R 31/38; G01R 31/382; G01R 31/3835; H02J 7/0048; H02J 7/0049; H01M 10/482; H01M 10/488; H01M 2220/10; G07C 2009/00634; G07C 2009/00642; G07C 9/00174; G07C 9/00309; G07C 2009/00365; G07C 2009/00373; G07C 9/00912; G07C 9/00896; E05B 47/00; E05B 47/0001; E05B 47/0012; E05B 2047/0018; E05B 2047/002; E05B 2047/0065; E05B 2047/0058; E05B 2047/0067; Y02E 60/10; G07F 9/001; G07F 9/002; G07F 9/02; G07F 9/026; G07F 17/10; G07F 17/12; G07F 17/13

See application file for complete search history.

(56) References Cited

U.S. PATENT DOCUMENTS

| | | |
|---|---|---|
| 2016/0133071 A1 | 5/2016 | Henderson |
| 2018/0315265 A1* | 11/2018 | Zabala Zabaleta .......................... G07C 9/00912 |
| 2019/0102962 A1* | 4/2019 | Miller ................ G07C 9/00309 |
| 2020/0187694 A1* | 6/2020 | Santangeli .............. G07F 17/12 |
| 2023/0187757 A1* | 6/2023 | Pouyadou ............. H02J 7/0047 429/7 |
| 2023/0190148 A1* | 6/2023 | Blackburn ......... A61B 5/14532 320/137 |

FOREIGN PATENT DOCUMENTS

| | | |
|---|---|---|
| EP | 3671667 A1 | 6/2020 |
| EP | 3671670 A1 | 6/2020 |
| EP | 3671671 A1 | 6/2020 |

\* cited by examiner

SYSTEMS AND METHODS FOR ALERTING FOR A LOW BATTERY STATE OF CHARGE FOR AUTONOMOUS PARCEL LOCKERS

FIELD OF THE INVENTION

The present invention relates to a system and methods for depositing shipments by a delivery agent, into electronic parcel lockers constituted of autonomous lockable compartments, and for picking-up these shipments thereafter.

BACKGROUND OF THE INVENTION

Prior Art

Electronic parcel locker systems are used for dropping-off, storing and picking up various kinds of shipments such as parcels or packages. These parcel locker systems are used by carrier agents for depositing shipments, which are then picked-up from the parcel lockers by recipients, or may eventually be collected by a carrier agent for freeing the parcel lockers for other shipments, if the shipments are not picked up in due time by the recipients. A typical architecture for electronic parcel locker systems generally comprises a network of parcel lockers, all communicating directly with a remote shipping system in charge of managing the network of parcel lockers, and of also managing data exchanges with the carrier information systems. Communication between each parcel locker and the remote shipping system is performed by long distance communication technologies such as 3G-4G or GSM. Such electronic parcel locker systems have several issues, including the necessity for an electrical power connection and the need for costly long distance communication, which does not operate everywhere.

A new generation of parcel lockers constituted of smart autonomous compartments, and allowing for cost reduction and more flexibility, including in particular compartments swaps, has been described in patent application EP3671665, or in the patent applications EP3671666 or EP3671667 for smart autonomous compartments clusters. These smart autonomous compartments can communicate with and be operated by mobiles devices such as smartphones. Such smart autonomous compartments operate without any electrical power connection and rely only on replaceable electrical batteries. Whenever the replaceable battery charge for the operation of a compartment is too low, the opening of the compartment is impossible, either for depositing a parcel by a delivery agent into the compartment or for picking-up by a recipient a parcel from the compartment. Eventually, no communication may be possible between the smart autonomous compartment and any mobile device, and therefore no alerting can then be carried out. Such disruption in the operation of a smart autonomous compartment is not acceptable, and alerting in due time for the future necessary replacement of a compartment battery is an absolute requirement.

Each smart autonomous compartments cluster is controlled by a locker module, which is powered by batteries. In a particular embodiment, the locker module may be dedicated to a single compartment. The electrical charge of a locker module batteries is consumed by the continuous powering of the locker module, the communication exchanges between the locker module and mobile devices, and by the unlocking of compartments. Although the battery energy is primarily required for the communication of a locker module and for the brief peaks of power associated with compartment door unlockings, most of the time, the battery is simply powering the control electronics of the locker module. It has been found that a measurement of the voltage at the battery terminals, typically during the simple electronics powering or even during a communication, cannot not be reliably used for determining the battery state of charge and for accurately predicting and alerting when a low battery level has been reached. For example, in the case of an alkaline battery, the battery voltage decreases with the service hours. An alkaline battery is considered fully discharged when its voltage reaches 0.8V. But, it generally does not operate correctly once it reaches about 1V, especially for unlocking a door. The minimum battery voltage for opening a door to be measured with zero-load or during the simple electronics powering, varies significantly depending on the battery. As a result, the definition of a reference battery minimum voltage measured during the simple electronics powering may result in alerting too late after the battery is discharged. Some batteries, which still have a voltage above the reference battery minimum voltage, are not able to provide enough power for opening a compartment door. And, if the reference battery minimum voltage is set too high, numerous batteries may be replaced while there are still usable. So, there is a need for a method and a system for alerting when the battery of a locker module of a smart autonomous compartments cluster is discharged and cannot perform the unlocking of a door.

OBJECT AND DEFINITION OF THE INVENTION

It is an object of the present invention to overcome or ameliorate at least one or more of the above issues. This object is achieved by providing an autonomous compartments cluster interacting locally with a mobile device via a short distance wireless communication, comprising: at least one compartment equipped with a door and an actuator for unlocking the door, a locker module controlling the actuator, and a battery pack powering the locker module and the at least one compartment, characterized in that the locker module comprises a voltage comparator configured to trigger an alert signal for replacing said battery pack and comparing an output voltage provided at the terminal of the battery pack with a reference minimal voltage, a first-step converter for energizing said actuator, and a controller configured to change a battery status stored in a memory of said locker module from a usable battery status to a low battery status, wherein said reference minimal voltage is a minimum transitory voltage at the terminals of the battery pack resulting from the energizing of the actuator by the first step-up converter during an unlocking initiation of the door.

In a particular embodiment, the minimum transitory voltage corresponds to a minimum input voltage for the first step-up converter to operate.

In a preferred embodiment, the locker module comprises a second step-up converter delivering a constant voltage for energizing the voltage comparator, the controller and the memory.

Advantageously, the memory, in which the battery status is stored, is a volatile memory so that a low battery status is automatically reset to a usable battery status when the locker module is powered up with a new battery pack after a battery pack replacement, therefore having the battery status automatically reinitialized at the usable battery status after a replacement of the battery pack.

Another object of the invention is that the low battery status is a state of charge where a battery charge of the autonomous compartments cluster has become so low as allowing no further unlocking the door or only one unlocking of any door of the autonomous compartments cluster other than the door.

In another embodiment of the invention, the actuator is constituted of an electrical motor and a gear box actioned by the motor and a mechanical pushing element translated by the electrical motor and the gear box so as to release a mechanical latch for unlocking the door.

According to another feature of the invention, the voltage comparator is constituted of an operational amplifier having positive and negative inputs, wherein the negative input is fed by an output voltage from a positive terminal of the battery pack and is protected by a 470 picoFarad capacitor connected to the ground, and wherein the positive input is fed with the reference minimal voltage.

In a preferred embodiment, the battery pack is be constituted of two type C 1.5V alkaline batteries.

The invention also concerns a method for alerting for a low battery state of charge for an autonomous compartments cluster interacting locally with a mobile device via a short distance wireless communication, the method comprising: requesting via the mobile device an unlocking of a door of at least one compartment of said autonomous compartments cluster, initiating by a first step-up converter an energizing of the actuator for unlocking the door resulting in a minimum transitory voltage at the terminals of a battery pack powering said at least one compartment and a locker module controlling said actuator, comparing by a voltage comparator an output voltage at the terminals of the battery pack with a reference minimal voltage, which correspond to a minimum transitory voltage at the terminals of the battery pack during the unlocking initiation of the door, and if the output voltage is determined as lower than the reference minimal voltage, an alert signal is triggered by the voltage comparator for replacing the battery pack and a battery status stored in a memory of the locker module is changed by a controller from a usable battery status to a low battery status.

According to a feature of the invention, the minimum transitory voltage corresponds to a minimum input voltage for the first step-up converter to operate.

In a preferred embodiment, a second step-up converter comprised in the locker module maintains a constant voltage for energizing the voltage comparator, the controller and the memory.

According to another feature of the invention, the battery status is set to the usable battery status during an initialization phase of the autonomous compartments cluster.

In another embodiment, the method also comprises communicating the low battery status by the autonomous compartments cluster to the mobile device using the local short distance wireless communication system.

Preferably, the method further comprises communicating the low battery status by the mobile device to a remote shipping system using a long distance communication network, and storing the low battery status in the remote shipping system and associating the low battery status with an identification of the autonomous compartments cluster in the remote shipping system. Therefore, based on this low battery status and its association with the autonomous compartments cluster, notifications to appropriate actors and processes for replacing the battery pack of the autonomous compartments cluster can then be initiated.

Advantageously, the method further comprises excluding depositing a parcel by a carrier agent or by a shipper in the autonomous compartments cluster with the low battery status.

In a preferred embodiment, the method further comprises communicating the low battery status by the autonomous compartments cluster to the mobile device within a broadcasted short message while the autonomous compartments cluster is in sleep mode, which does not require establishing a two-way communication, and therefore minimizing power consumption for the autonomous compartments cluster.

In a particular embodiment, the method further comprises setting the battery status to the usable battery status following on a replacement of the battery pack.

Another object of the invention is to continue operating the autonomous compartments cluster without changing the battery status from the usable battery status to the low battery status if the output voltage is determined as higher than the reference minimal voltage.

One particular advantage of the invention is that the battery status is set to the usable battery status when the locker module is initially powered, and in that the battery status is changed from the usable battery status to the low battery status when the voltage comparator triggers an alert signal that is a first alert signal since a latest replacement of the battery pack.

BRIEF DESCRIPTION OF THE DRAWINGS

Other aspects, features and advantages of the teachings of the invention will become clearer to those ordinary skilled in the art upon review of the following description in conjunction with the accompanying drawings where.

DETAILED DESCRIPTION

Figure 1:
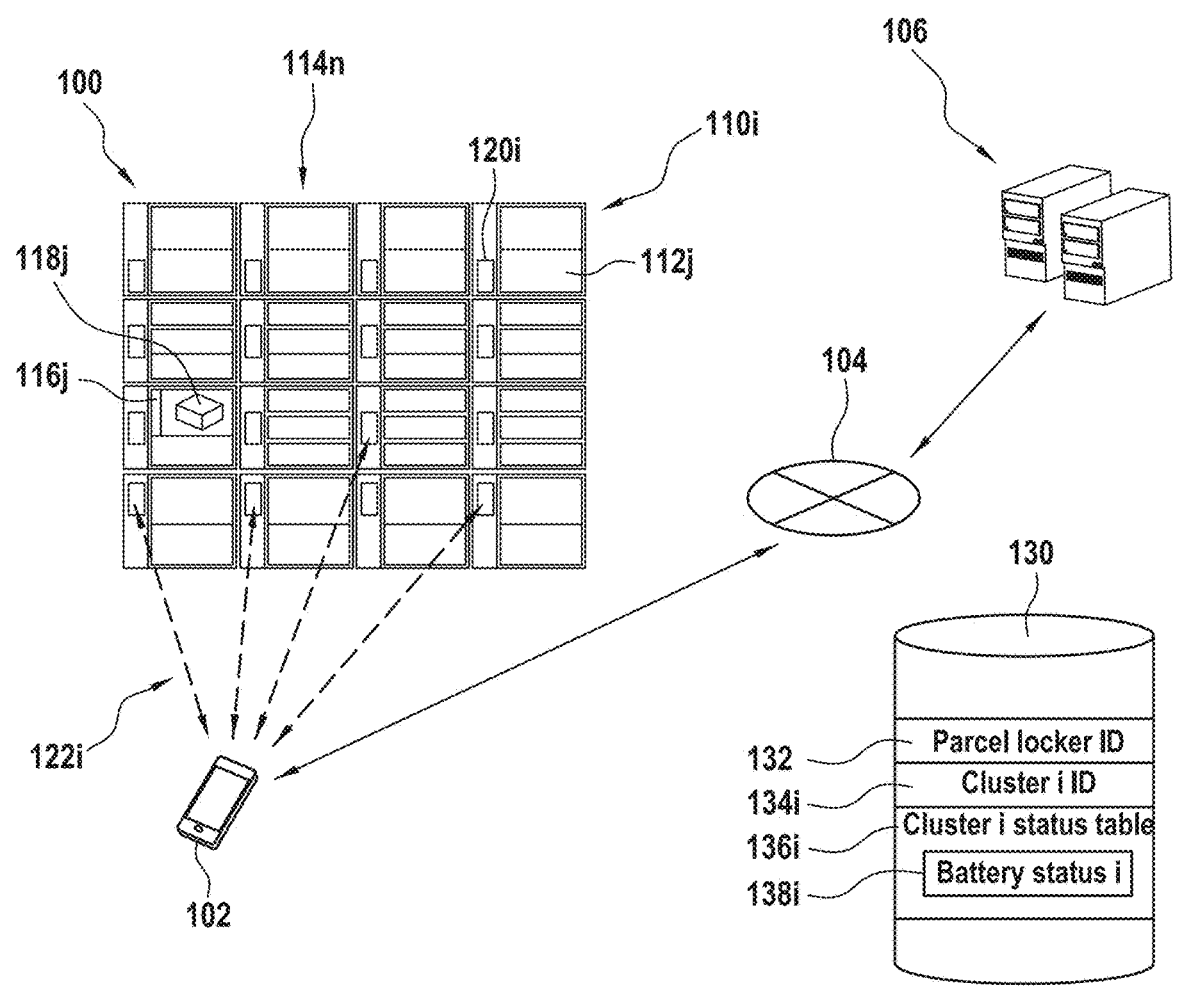
FIG. 1 illustrates a parcel locker system constituted of autonomous compartments clusters interacting locally with mobile devices via short distance wireless communication.

FIG. 1 illustrates an embodiment of a parcel locker 100 constituted of autonomous compartments clusters interacting locally with a mobile device 102 via short distance wireless communication. The mobile device communicates via a long distance communication network 104 based on a technologies such as 3G-4G or GSM with a remote shipping system 106, which manages information regarding the parcel locker 100 including authorization access to the parcel locker and data regarding the shipments handled by the parcel locker. The parcel locker can be controlled by a mobile device 102, which can be used as a user interface for operating the compartments of the parcel locker. The parcel locker 100 is constituted of autonomous compartments clusters 110i, which may comprise several compartments 112j. So as to be easily handled during installation on site or for swapping deficient components, such compartment clusters typically comprise two or three compartments, or eventually only one large compartment. The compartment clusters can be piled up and mechanically fastened together to form a column 114. An autonomous compartments cluster is characterized by a design without any power connection or long distance communication, allowing for simple installation and configuration upgrade and servicing. The columns 114 can be mechanically fastened together to form a larger parcel locker unit. Each compartment 112j is equipped on the front with a hinged door 116j, which when opened allows for depositing in the compartment or retrieving from the compartment a parcel 118j. Each autonomous compartments cluster 110i comprises a locker module 120i, which electronically controls the locking and unlocking of each door of the compartments of the cluster. Each locker module 120i can establish a local communication with a nearby mobile device 102 via a short distance communication 122i, such as WIFI, IR or Bluetooth, using a radio transceiver module and an antenna. The mobile device can be a smartphone or personal digital assistant (PDA) or any computerized mobile device having some short distance communication capabilities compatible with the short distance communication capabilities of the locker modules and having some long distance communication capabilities compatible with the long distance communication capabilities of the remote shipping system 106. The remote shipping system comprises a database system 130, which may include several databases eventually installed on several server systems operated by shipping carriers or by a service company owning or managing a parcel locker park. The database system 130 stores configurations of all the parcel lockers 100 to be controlled by the remote shipping system. Each parcel locker configuration (PL configuration) includes a unique parcel locker identification 132, and for each compartments cluster 110i of the parcel locker, a unique cluster identification 134i. The PL configuration also includes for each compartments cluster a cluster status table 136i including a battery status for the locker module of the compartments cluster. The cluster status table also includes for each compartment of the compartments cluster: a compartment identification, a status of the lock (locked/unlocked), a status of the door (opened/closed), whether the compartment is damaged or operational, or whether the compartment is clean or dirtied.

The locker module 120i controlling the autonomous compartments cluster 110i is powered by a battery pack. For minimizing the power consumption of the locker module, low energy modes or sleep modes can be implemented. When a compartments cluster is not in use, the locker module can be in a deep sleep mode, i.e. in a very low energy mode so as to minimize the power consumption of the compartments cluster. In such deep sleep mode, the energy level of the compartments cluster is below 10% of the average energy consumption when the compartments cluster is awake and fully operational. Only very limited functions are available, and in particular the radio transceiver module is asleep and the locker module cannot communicate with and cannot be wakened up by a mobile device proximate to the autonomous compartments cluster. In order to allow for initiating a communication session with a mobile device, when in deep sleep mode, the locker module temporarily partially wakes-up for broadcasting short messages. This partial wake-up, corresponding to a low energy sleep mode, activates the radio transceiver module and can be controlled by an energy management module. In sleep mode, additional functionalities, compared to the deep sleep mode, is limited to sending broadcasted short messages and waiting for a response, and the power consumption is limited. For operating the autonomous compartments cluster and establishing a communication with a mobile device, a full wake-up of the locker module is required, and the power consumption is increased. During the exchange phases between the locker module and the mobile device, some additional electrical power is required for activating the radio transceiver and the antenna performing the reception or the emission of messages, increasing the power consumption of the locker module. When a door opening is requested, the unlocking requires a temporary power surplus demand from the battery for a fraction of a second. The initiation of the unlocking results in a transitory current surge and a transitory voltage drop at the terminals of the battery at the beginning of the temporary power surplus demand corresponding to a minimum transitory voltage. It has been determined that, if the minimum transitory voltage is too low, the unlocking cannot be performed. According to the invention, the minimum transitory voltage is identified as an appropriate measurement for characterizing the battery state of charge of a smart autonomous compartments cluster. The definition of a reference minimal voltage for unlocking a door and the comparison of the measured minimum transitory voltage each time the door is unlocked with this reference minimal voltage can be used for alerting for battery replacement.

As the power required for the different operations of an autonomous compartments cluster other than for the unlocking of a door is significantly lower than the power required for unlocking a door, following on a battery alert based on a voltage drop during unlocking, the overall operation of the autonomous compartments cluster may still continue, including the communication between the smart autonomous compartments cluster and any mobile device, at least until the next request for a door unlocking of a compartment of the autonomous compartments cluster.

Figure 2:
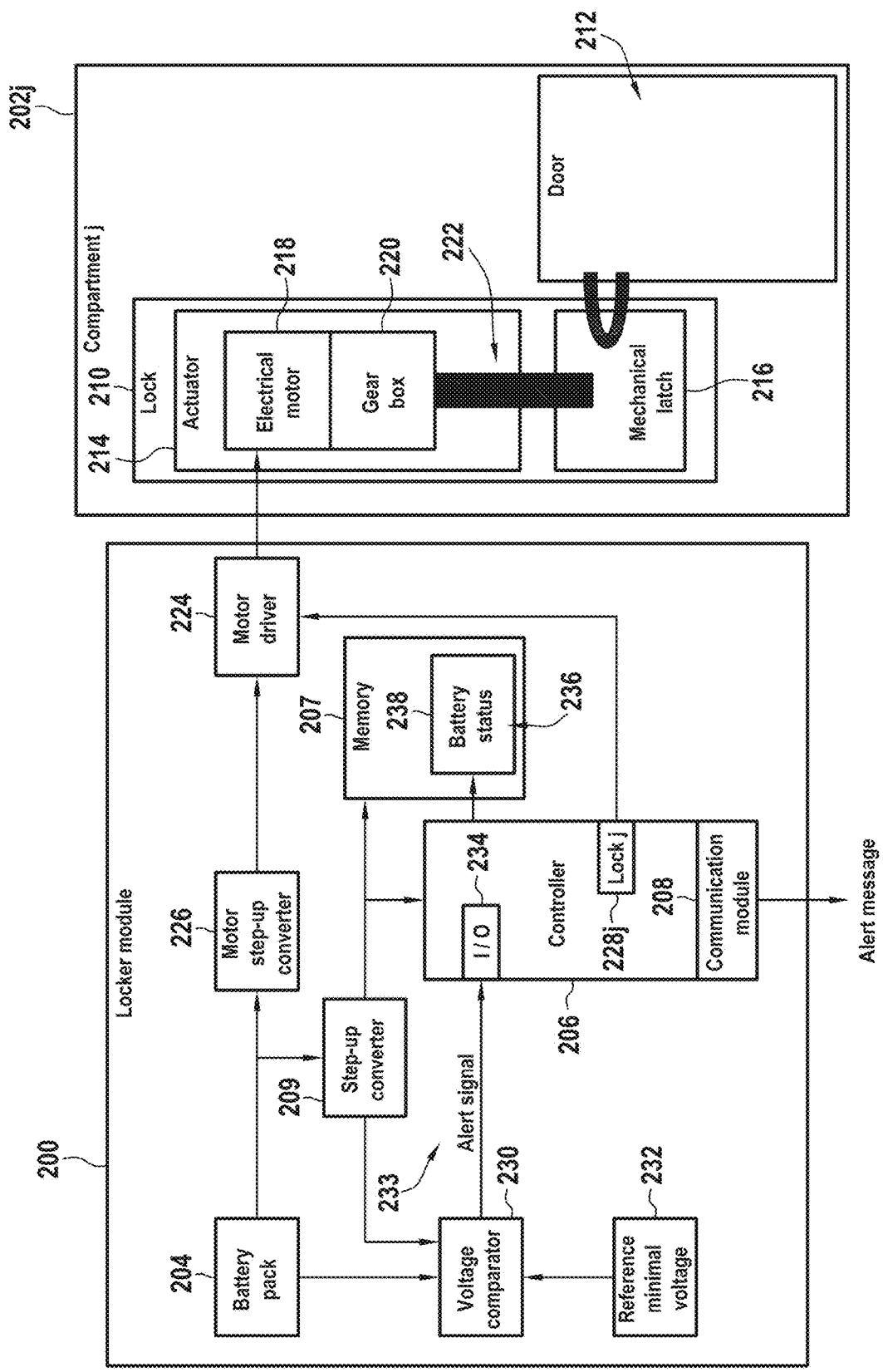
FIG. 2 illustrates a system embodying the present invention for alerting for a low battery state of charge for an autonomous compartments cluster.

FIG. 2 illustrates a system for alerting when the battery charge of an autonomous compartments cluster becomes too low for opening a compartment door according to an embodiment of the invention. A locker module 200 controls one compartment j 202j or several compartments 202j, which can constitute an autonomous compartments cluster. The locker module is powered by a replaceable battery pack 204 included in the smart compartments cluster, and preferably included in the locker module. The replaceable battery pack can be constituted of alkaline batteries, which are readily available at low cost and are appropriate for indoor usage. In a preferred embodiment, the replaceable battery pack is constituted of two type C 1.5V alkaline batteries, typically providing about 3.2V zero-load voltage output early in its lifecycle before it starts being discharged. For outdoor usage, other battery types may be preferred, such as lithium batteries, because alkaline batteries performances worsen at low temperatures. The battery pack powers the electronics components of the locker module, including a locker module controller 206, which typically can be a microprocessor, and a locker module memory 207 and a communication module 208. The communication module allows the locker module for communicating with mobile devices and may be included in the processor 206 or may be a component separate from the controller. In order to correct for the decreasing voltage of the battery pack, a step-up converter 209 can be used for maintaining a constant voltage for powering the locker module electronics components. In a preferred embodiment, the step-up converter provides a 3.3V output.

The compartment j is equipped with a lock 210 for locking a door 212 of the compartment j. The unlocking of the door is performed be by an electrical actuator 214. In a preferred embodiment, the lock is constituted of a mechanical latch 216 and the electrical actuator is constituted of an electrical motor 218, which when energized, actions a gear box 220, which then translates a mechanical pushing element 222, which can release the mechanical latch and unlock the door. Once the door is released, a spring mechanism can then push the door opened. For closing the door, a user would have to push back the door against the spring mechanism until it is mechanically locked by mechanical latch. The electrical motor can be controlled by a motor driver 224, which is preferably located in the locker module and can be used for the control of all the compartments of the autonomous compartments cluster. In order to correct for the decreasing voltage of the battery pack, a motor step-up converter 226 can be used for maintaining a constant voltage for energizing the electrical motor and the motor driver. In a preferred embodiment, the electrical motor requires a 5V power input and the motor step-up converter 226 provides a 5V output. In a particular embodiment, the motor step-up converter is a MAXIM MAX8815A model with an input voltage 1.2V to 5.5V with a 2 MHz oscillator.

When a user requests via his mobile device the opening of a particular compartment door of an autonomous compartments cluster, the user request is received by the locker module of that particular autonomous compartments cluster via its communication module. The user request is provided by the communication module to the controller of the locker module, which sends an unlock order to a lock corresponding to the particular compartment door. The unlock order can be provided by a controller output port 228j dedicated for unlocking the particular compartment j. The unlock order can consist in switching the voltage of the output port 228j from 0V to 3.3V for a limited duration during which the compartment actuator 214 is energized for unlocking the door. The unlock order is provided to the motor drive or directly to the electrical motor of the actuator.

Figure 3:
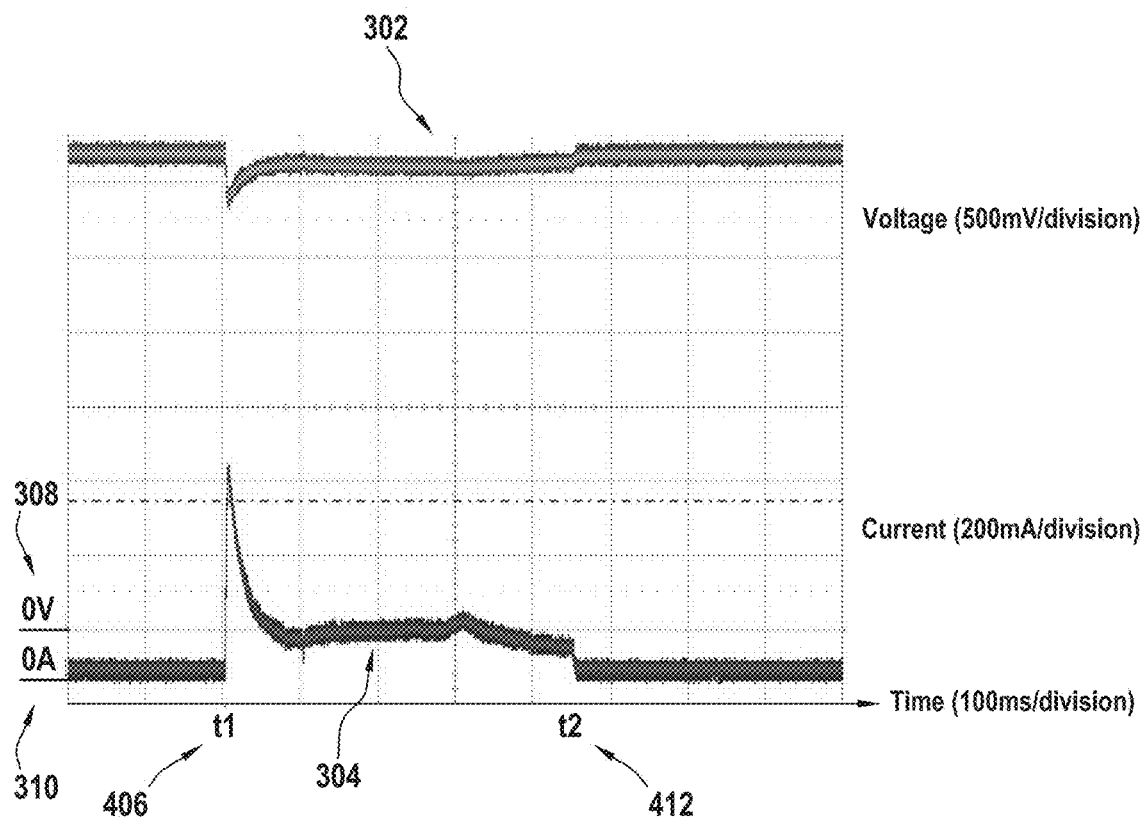
FIG. 3 represents the measurements of the voltage and of the current provided by a two batteries pack during the unlocking of a compartment door as a function of time for a preferred embodiment of the invention.

FIG. 3 represents the measurements of the voltage 302 and of the current 304 provided by the battery pack during the unlocking of a door as a function of time for a preferred embodiment of the invention with a 5 VDC electrical motor (for example a motor-actuator Southco 3-AC-EM-99-125) and a battery pack with two type C 1.5V alkaline batteries. Before the actuator is energized at the time t1 306, the battery pack provides a voltage around 3.2V (compared to the voltage reference level 0V 308) and a current around a few mA (compared to the current reference level 0 A 310). This situation corresponds to a battery pack early in its lifecycle before it starts being discharged, and a locker module, which is awaken, but requiring limited power as it is not in the process of exchanging messages with a mobile device. Between the time t1 and the time t2 312, the actuator is energized for unlocking the door, and the battery pack provides a 120 mA current surplus and a slightly lower voltage around 3.1V. The unlocking of a door requires around 360 mW during 0.45 seconds, which is a significantly higher power requirement than the average power consumption of the locker module, in sleep mode, which is about 1.5 mW, or when the locker module is awake and performs communication exchanges with mobile devices, which is about 25 mW. The initiation of the unlocking at the beginning of the temporary power surplus demand for unlocking results in a transitory current surge of 560 mA and a transitory voltage drop at the terminals of the battery to 2.8V, corresponding to a power peak of about 1.5 W.

Figure 4:
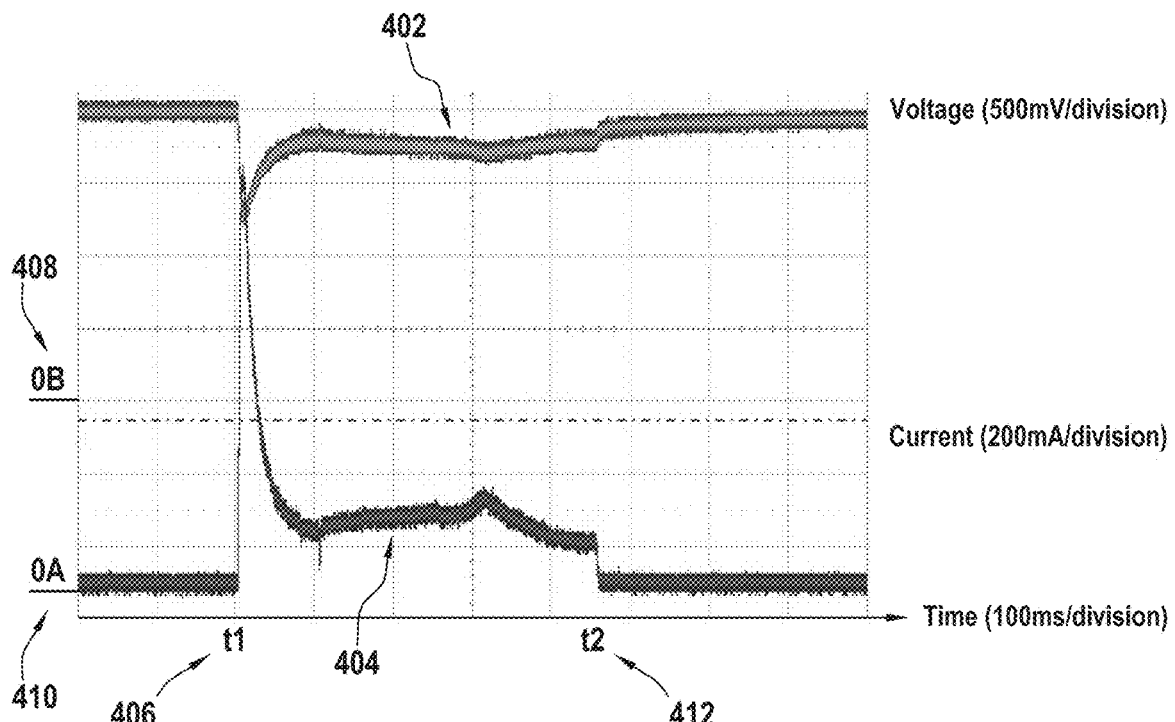
FIG. 4 represents the measurements of the voltage and of the current provided by a two batteries pack during the unlocking of a compartment door as a function of time for a battery pack advanced in its lifecycle and already partially discharged.

FIG. 4 represents, for a battery pack advanced in its lifecycle and already partially discharged, the measurements of the voltage 402 and of the current 404 provided by the battery pack during the unlocking of a door as a function of time for a preferred embodiment of the invention with a 5 VDC electrical motor (for example a motor-actuator Southco 3-AC-EM-99-125) and a battery pack with two type C 1.5V alkaline batteries. Before the actuator is energized at the time t1 406, the already partially discharged battery pack provides a voltage around 2V (compared to the voltage reference level 0V 408) and a current around a few mA (compared to the current reference level 0 A 410). This situation corresponds to a locker module, which is awaken, but requiring limited power as it is not in the process of exchanging messages with a mobile device. Between the time t1 and the time t2 412, the actuator is energized for unlocking the door, and the battery pack provides a 200 mA current surplus and a slightly lower voltage around 1.8V. The unlocking of a door therefore requires around 360 mW during 0.45 seconds, which is a significantly higher power requirement than the average power consumption of the locker module, in sleep mode, which is about 1.5 mW, or when the locker module is awake and performs communication exchanges with mobile devices, which is about 25 mW. The initiation of the unlocking at the beginning of the temporary power surplus demand for unlocking results in a transitory current surge of 1160 mA and a transitory voltage drop at the terminals of the battery to 1.2V, corresponding to a power peak of about 1.4 W.

Figure 5:
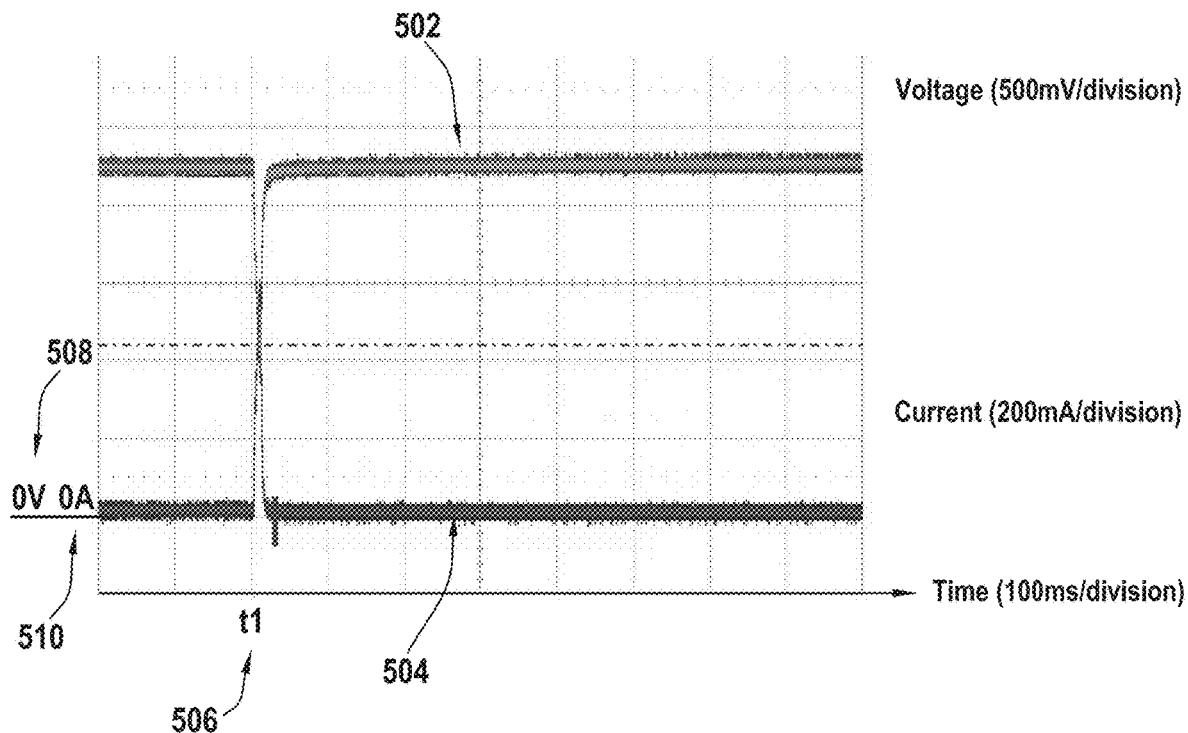
FIG. 5 represents the measurements of the voltage and of the current provided by a two batteries pack during the unlocking of a compartment door as a function of time for a battery pack too much discharged for unlocking a compartment door.

FIG. 5 corresponds to a battery pack too much discharged for unlocking a compartment door. FIG. 5 represents, the measurements of the voltage 502 and of the current 504 provided by the battery pack during the unlocking of a door as a function of time for a preferred embodiment of the invention with a 5 VDC electrical motor (for example a motor-actuator Southco 3-AC-EM-99-125) and a battery pack with two type C 1.5V alkaline batteries. Before the actuator is energized at the time t1 506, the discharged battery pack provides a voltage around 2.3V (compared to the voltage reference level 0V 508) and a current around a few mA (compared to the current reference level 0 A 510) when the locker module is awaken and operational, but requiring limited power as it is not in the process of exchanging messages with a mobile device. At the time t1, the actuator is energized for unlocking the door, and the battery pack provides a transitory current surge of 600 mA and a transitory voltage drop at the terminals of the battery to 0.85V. However, the battery pack cannot provide enough power (0.5 W in this case) for unlocking the door. The actuator cannot operate and the electrical motor does not start. After the transitory current surge, the current provided by the battery pack returns to around a few mA (typically around 40 mA), and the voltage provided by the battery pack returns to 2.3V. It can be pointed out that the autonomous compartments cluster for FIG. 5 is different from the autonomous compartments cluster for FIG. 4, and the voltage provided by the battery pack for FIG. 5 is higher than the voltage provided by the battery pack for FIG. 4 when the corresponding locker modules are awaken. This shows that although the voltage provided by the battery pack for FIG. 5 is higher than the voltage provided by the battery pack for FIG. 4, the battery pack for FIG. 5 cannot unlock a door, while the battery pack for FIG. 4 can unlock a door, therefore showing that a measurement of the voltage at the battery terminals, typically during the simple electronics powering cannot not be reliably used for determining the battery state of charge and the usability of the battery for unlocking a compartment door.

In order to alert when a battery charge of an autonomous compartments cluster is too low for opening a compartment door, a system according to an embodiment of the invention is illustrated on FIG. 2. A voltage comparator 230 compares the voltage provided by the battery pack with a reference minimal voltage 232 for an actuator to unlock a door. As long as the battery pack voltage is above the reference minimal voltage, the voltage comparator does not provide any alert signal. When the battery pack voltage becomes lower than the reference minimal voltage, the voltage comparator triggers an alert signal 233 to an input I/O 234 of the locker module controller. The comparator detects a low battery pack voltage during the initiation of a door unlocking resulting in a transitory voltage drop at the terminals of the battery pack, and if the battery pack has reached a critical discharge level. If this is the first alert signal triggered by the comparator since the latest battery pack replacement, the door unlocking can be carried out as well as the on-going powering of the locker module including communication with mobile devices. Eventually, even a few more door unlockings may be performed. However, when the comparator triggers an alert signal, an alert message must be provided by the locker module for replacing the battery pack. As soon as the voltage comparator triggers a first alert signal, the locker module controller detects a status change on its input I/O 234 and changes a locker module battery status 236 stored in a memory allocation 238 of the locker module memory, for example via an interrupt operation. After the triggering of a first alert signal and after the transitory voltage drop during the initiation of a door unlocking, the battery pack voltage returns to a higher level during the phase of energizing the actuator for unlocking the door, and the comparator output returns to a no alert signal. In a preferred embodiment, the battery status is stored in a volatile memory. By default, when the locker module is initially powered, the battery status is set to "usable battery" and can be a Boolean set to 1. When a first alert signal is triggered by the comparator, the battery status is set to "low battery", which in the case of a Boolean can be set to 0. When the battery pack is replaced, the locker module is temporarily not powered anymore. After the battery pack replacement, the locker module is powered again and the volatile memory is reinitialized. The battery status in the memory allocation of the volatile memory is set to "usable battery".

After the storage of a "low battery" status, the locker module can transfer via the communication module an alert message 240 to the mobile devices so that the battery pack can be replaced. Although the alert signal triggered by the comparator in only transitory, the battery status stored in the locker module memory remains permanent status until the battery pack replacement.

Figure 6:
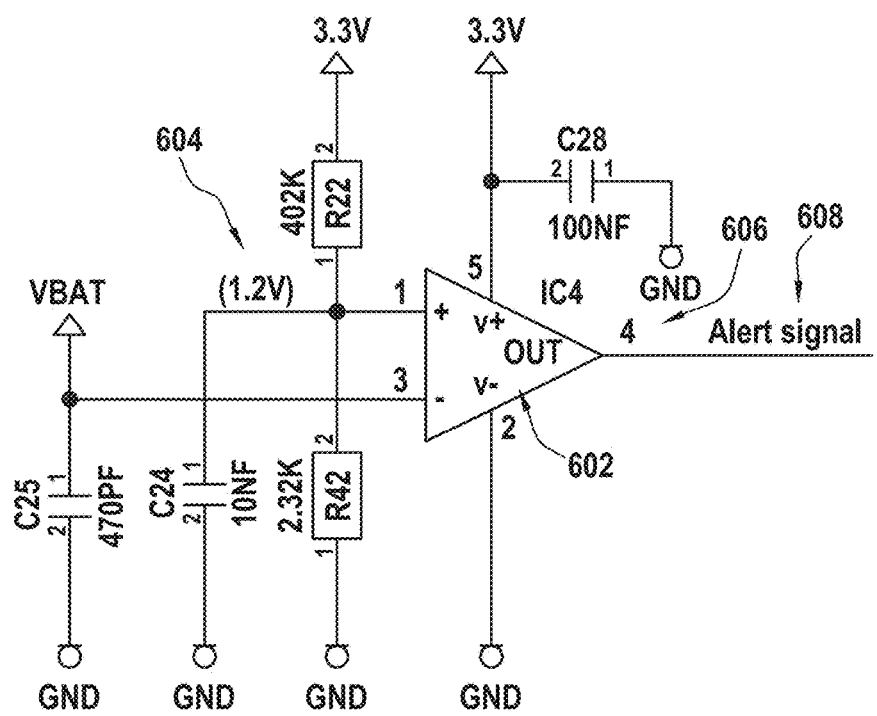
FIG. 6 illustrates a comparator used by a system for alerting for a low battery state of charge according to a particular embodiment of the invention.

FIG. 6 illustrates a comparator used by a system for alerting when a battery pack charge level of an autonomous compartments cluster is too low for unlocking a compartment door according to a particular embodiment of the invention. The output voltage from the positive terminal of the battery pack VBAT is fed into the negative input of an operational amplifier 602. Preferably, the operational amplifier 602 is a LMV7275 model. A 470 picoFarad capacitor C25 connected to the ground protects the negative input of the operational amplifier from high frequency voltage perturbations as it shortcuts to the ground any potential high frequency noise. The positive input of the operational amplifier 602 is fed with a reference minimal voltage 604. In a particular embodiment using a MAXIM MAX8815A model motor step-up converter and a battery pack with two type C 1.5V alkaline batteries, the reference minimal voltage is set to 1.2V corresponding to the minimum input voltage for the motor step-up converter to operate. The 1.2V reference minimal voltage can be obtained from the 3.3V step-up converter 209 reduced by the resistors R22 and R42 mounted in series, where R22 can be a 402 K ohm resistor and R42 can be a 232 K ohm resistor connected to the ground. A 10 nanofarad capacitor C24 connected in parallel with resistor R42 protects the positive input of the operational amplifier from high frequency noise as it shortcuts the positive input of the operational amplifier to the ground.

As long as the battery pack output voltage VBAT remains above the reference minimal voltage, the output voltage 606 of the operational amplifier remains at 0V, and the locker module controller does not detect any battery alert signal. As soon as the battery pack output voltage VBAT becomes lower than the reference minimal voltage, the output voltage 606 of the operational amplifier switches to 3.3V, resulting in the locker module controller detecting an alert signal 608. As previously explained, the battery pack output voltage VBAT becoming lower than the reference minimal voltage occurs first due to a transitory voltage drop at the terminals of the battery during the initiation of a door unlocking, and when the battery pack has reached a critical discharge level. After the transitory voltage drop during the initiation of a door unlocking, the battery pack voltage returns to a higher level during the phase of energizing the actuator for unlocking the door, and the output voltage 606 of the operational amplifier generally returns back to 0V. However, the locker module battery status 236 remains stored in a memory allocation 238 of the locker module memory, until the replacement of the battery pack takes place.

Figure 7:
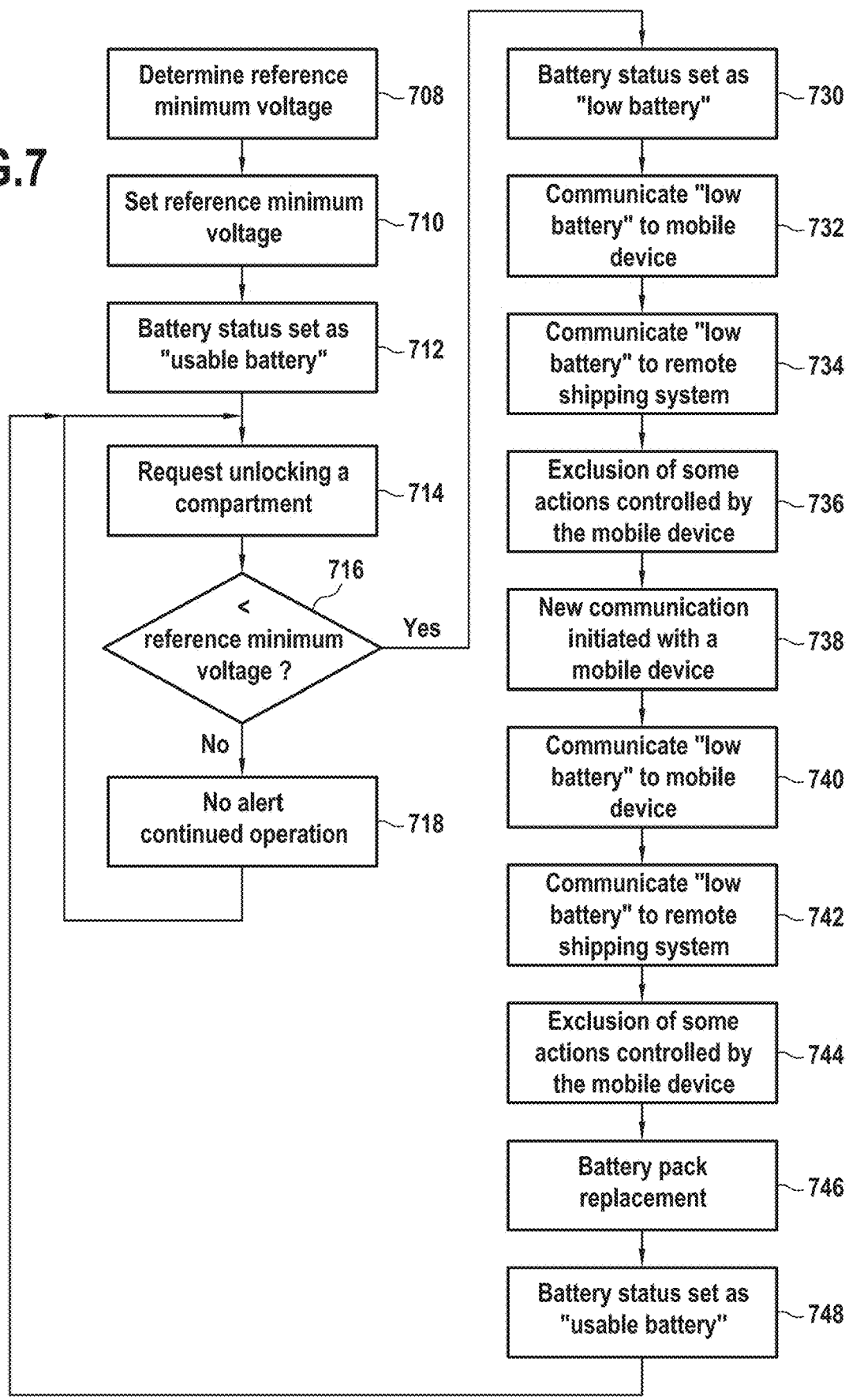
FIG. 7 illustrates a method for alerting for a low battery state of charge according to an embodiment of the invention.

A method for alerting for a low battery state of charge is now described in reference with FIG. 7. The method applies to autonomous clusters of compartments interacting locally with mobile devices via short distance wireless communication. Each autonomous compartments cluster controls the locking and unlocking of each door of the compartments of the cluster and is powered by a replaceable battery pack, whose state of charge and voltage decrease with the usage of the autonomous compartments cluster. In order to avoid disrupting the operation of the autonomous, alerting for the necessary replacement of the battery pack of an autonomous compartments cluster is an absolute requirement. As previously explained, a maximum power required from the battery pack occurs for unlocking a door, and the minimum transitory voltage at the terminals of the battery pack occurring during the initiation of a door unlocking is identified as an appropriate measurement for characterizing the battery pack state of charge.

The method begins in act 708 by determining a reference minimal voltage defining a voltage level below which a battery alert signal is triggered. The reference minimal voltage corresponds to a minimum transitory voltage provided to the unlocking mechanism by the battery pack for unlocking a door. Preferably, in order to correct for the decreasing voltage of the battery pack, a motor step-up converter is used for maintaining a constant voltage for energizing the unlocking mechanism of the compartments. In a particular embodiment, the reference minimal voltage is determined as the minimum input voltage of the motor step-up converter to operate. In act 710, the reference minimal voltage value is set within the autonomous compartments cluster and can be stored in a memory of the autonomous compartments cluster or can correspond to a voltage level resulting from an electronic sub-circuit such as illustrated on FIG. 6. In act 712, a battery status for the autonomous compartments cluster is set to "usable battery". The setting of the battery status as "usable battery" can occur during the initialization phase of the autonomous compartments cluster, which can take place during the manufacturing phase or during the installation phase of the autonomous compartments cluster. Preferably, the battery status is automatically set to "usable battery" by default, for example during the first powering up of the autonomous compartments cluster during the manufacturing phase or during the installation phase. In act 714, a user requests via his user mobile device for the unlocking of a compartment of the autonomous compartments cluster for accessing the compartment. The unlocking request can be part of the delivery process performed by a carrier delivery agent for depositing parcels in the autonomous compartments cluster or can part of the pick-up process performed by a recipient for retrieving a parcel from the autonomous compartments cluster or can be part of the collection process performed by a carrier delivery agent for retrieving parcels, which are overdue, from the autonomous compartments cluster. In act 716, the battery pack output voltage measured at the terminals of the battery pack is compared with the reference minimal voltage. As long as the battery pack output voltage value remains higher than the reference minimal voltage value, operation of the autonomous compartments cluster continues without any alert regarding the battery status, nor any change regarding the battery status for the autonomous compartments cluster as illustrated in act 718, and the compartment can be unlocked as requested by the user. Then, the actions concerning the compartment may be completed. A new request for the unlocking of a compartment of the autonomous compartments cluster can later be performed via the same user mobile device or another user mobile device returning to act 714.

As soon as the battery pack output voltage value is detected as lower than the reference minimal voltage value, the battery status for the autonomous compartments cluster is set in act 730 to "low battery". As mentioned above, such a low battery detection always occurs for the first time due to a transitory voltage drop at the terminals of the battery during the initiation of a door unlocking, and when the battery pack has reached a critical discharge level. The battery pack output voltage can be measured at other times than after an unlocking request or even continuously. However, a low battery detection will always occur for the first time after an unlocking request. The door unlocking is completed as requested by the user, for this first time of low battery detection at least. In act 732, the "low battery" status is communicated by the autonomous compartments cluster to the user mobile device using a local short distance wireless communication system. In act 734, the "low battery" status of the autonomous compartments cluster is communicated by the user mobile device to a remote shipping system using a long distance communication network and can be stored and associated with an identification of the autonomous compartments cluster in the remote shipping system. Based on this "low battery" status and its association with the autonomous compartments cluster, notifications to appropriate actors and processes for replacing the battery pack of the autonomous compartments cluster can then be initiated.

Depending on his credentials and rights, a user can perform various actions as he operates the autonomous compartments clusters of a parcel locker via his mobile device. However, following on the reception by the mobile device of the "low battery" status message, some actions related to the autonomous compartments cluster with the "low battery" status may be excluded in act 736. Preferably, for example, when the user is a carrier agent, the parcel deposit in compartments of the autonomous compartments cluster with the "low battery" status is excluded or when the user is a shipper wishing to send a parcel using a parcel locker, the parcel deposit in compartments of the autonomous compartments cluster with the "low battery" status is excluded. However, the parcel collection from these compartments may remain possible so that compartments of the autonomous compartments cluster with overdue parcels can be freed. The act 734 may also be performed after act 736 or eventually may be performed in parallel. Then, the actions concerning the compartment may be completed and the communication between the autonomous compartments cluster and the mobile device may be terminated.

Later, some new communication of the autonomous compartments cluster may be take place with the same user mobile device or with another user mobile device as illustrated in act 738. As the battery status for the autonomous compartments cluster has been set in act 730 to "low battery", the low battery information can be communicated by the autonomous compartments cluster. Preferably, the "low battery" status is communicated by the autonomous compartments cluster to the user mobile device using a local short distance wireless communication system as illustrated in act 740. In a preferred embodiment, the "low battery" status may be communicated by the autonomous compartments cluster to the user mobile device within a broadcasted short message, while the autonomous compartments cluster remains in sleep mode. Broadcasting short messages does not require establishing a two-way communication, therefore minimizing power consumption for the autonomous compartments cluster as described in the patent applications EP3671670 and EP3671671. The use of broadcasted short messages allows for the autonomous compartments cluster to be maintained in sleep mode, therefore minimizing the electrical consumption of the battery pack, and regularly broadcasting for short time windows some broadcasted short messages. As illustrated in act 742, the "low battery" status of the autonomous compartments cluster may then be communicated by the newly connected user mobile device to a remote shipping system using a long distance communication network. Such redundant communication may alleviate potential previous communication issues. Following on the reception by the mobile device of the "low battery" status message, some actions controlled by the mobile device regarding the autonomous compartments cluster with the "low battery" status may be excluded as illustrated in act 744. Preferably, when the user is a carrier agent, the parcel deposit in compartments of the autonomous compartments cluster with the "low battery" status is excluded or when the user is a shipper wishing to send a parcel using a parcel locker, the parcel deposit in compartments of the autonomous compartments cluster with the "low battery" status is excluded. However, when the user is a recipient, the parcel pick-up from these compartments may remain possible, or when the user is a carrier agent, the parcel collection from these compartments may also remain possible, so that the service provided by autonomous compartments cluster can be maintained and the parcels are not blocked into compartments of the autonomous compartments cluster.

Based on the communication of the "low battery" status either to a mobile device or to the remote shipping system, the battery pack can be replaced in act 746. A mobile device user can be informed of the "low battery" status of the autonomous compartments cluster and guided for the battery pack replacement a parcel locker via a diagnostics application or a parcel locker maintenance application running on his mobile device. The user replacing the battery pack can be the site manager or some authorized maintenance personnel. Following on the battery pack replacement, the battery status for the autonomous compartments cluster is set to "usable battery" in act 748, and standard operation of the autonomous compartments cluster can resume in act 714.

The invention claimed is:

1. An autonomous compartments cluster interacting locally with a mobile device via a short distance wireless communication, comprising:
    at least one compartment equipped with a door and an actuator for unlocking said door,
    a locker module controlling said actuator, and
    a battery pack powering said locker module and said at least one compartment,
    wherein said locker module comprises
        a first step-up converter for energizing said actuator,
        a voltage comparator configured to compare an output voltage provided at the terminal of said battery pack with a reference minimal voltage and trigger an alert signal for replacing said battery pack when said output voltage provided at terminals of said battery pack is lower than said reference minimal voltage, and
        a controller configured to change a battery status stored in a memory of said locker module from a usable battery status to a low battery status,
        wherein said reference minimal voltage is a parameter set according to a minimum transitory voltage at the terminals of said battery pack required to operate said actuator at least once for unlocking said door and corresponding to a time at, a temporary power surplus demand from the battery for a fraction of a second, said surplus demand happening in response to a door opening request and resulting from the energizing of said actuator by the first step-up converter during an initiation of unlocking of said door.

2. The autonomous compartments cluster according to claim 1, wherein said minimum transitory voltage corresponds to a minimum input voltage for said first step-up converter to operate.

3. The autonomous compartments cluster according to claim 1, wherein said locker module comprises a second step-up converter delivering a constant voltage for energizing said voltage comparator, said controller and said memory.

4. The autonomous compartments cluster according to claim 1, wherein said memory, in which said battery status is stored, is a volatile memory wherein said controller is configured to automatically reset said low battery status to said usable battery status when said locker module is powered up with a new battery pack after a battery pack replacement.

5. The autonomous compartments cluster according to claim 1, wherein the controller is configured to change said battery status to said low battery status when said minimum transitory voltage at the terminals of said battery pack is below said reference minimal voltage, wherein said reference minimal voltage is set to a value corresponding to a state of charge where a battery charge of said autonomous compartments cluster has become so low as allowing no further unlocking said door or only one unlocking of any door of said autonomous compartments cluster other than said door.

6. The autonomous compartments cluster according to claim 1, wherein said actuator is constituted of an electrical motor and a gear box actioned by said motor and a mechanical pushing element translated by said electrical motor and said gear box so as to release a mechanical latch for unlocking said door.

7. The autonomous compartments cluster according to claim 1, wherein said voltage comparator is constituted of an operational amplifier having positive and negative inputs, wherein said negative input is fed by an output voltage from a positive terminal of said battery pack and is protected by a 470 picoFarad capacitor connected to ground, and wherein said positive input is fed with said reference minimal voltage.

8. The autonomous compartments cluster according to claim 1, wherein said battery pack is be constituted of two type C 1.5V alkaline batteries.

9. A method for alerting for a low battery state of charge for an autonomous compartments cluster interacting locally with a mobile device via a short distance wireless communication, said autonomous compartments cluster comprising at least one compartment equipped with a door and an actuator for unlocking said door, a locker module controlling said actuator, and a battery pack powering said locker module and said at least one compartment, wherein said locker module comprises, a first step-up converter, a voltage comparator, and a controller said method comprising:
    receiving a door opening request, from said mobile device, requesting an unlocking of said door,
        initiating by the first step-up converter an energizing of said actuator for unlocking said door resulting in a minimum transitory voltage at terminals of said battery pack,
        comparing by the voltage comparator an output voltage at the terminals of said battery pack with a reference minimal voltage, said reference minimal voltage being a parameter set according to a minimum transitory voltage at the terminals of said battery pack required to operate said actuator at least once for unlocking said door and corresponding to a time at a temporary power surplus demand from the battery for a fraction of a second, said surplus demand happening in response to the door opening request is requested and resulting from the energizing of said actuator by the first step-up converter during said initiation of unlocking of said door, and
        if said output voltage is determined as lower than said reference minimal voltage, triggering an alert signal by the voltage comparator for replacing said battery pack and changing a battery status stored in a memory of said locker module by the controller from a usable battery status to a low battery status.

10. The method according to claim 9, wherein said minimum transitory voltage corresponds to a minimum input voltage for said first step-up converter to operate.

11. The method according to claim 10, wherein a second step-up converter comprised in said locker module maintains a constant voltage for energizing said voltage comparator, said controller and said memory.

12. The method according to claim 10, wherein said battery status is set to said usable battery status during an initialization phase of said autonomous compartments cluster.

13. The method according to claim 9, further comprising communicating said low battery status by said autonomous compartments cluster to said mobile device using said a local short distance wireless communication system.

14. The method according to claim 13, further comprising:
communicating said low battery status by said mobile device to a remote shipping system using a long distance communication network, and
storing said low battery status in said remote shipping system and associating said low battery status with an identification of said autonomous compartments cluster in said remote shipping system.

15. The method according to claim 14, further comprising: excluding depositing a parcel by a carrier agent or by a shipper in said autonomous compartments cluster with said low battery status.

16. The method according to claim 15, further comprising communicating said low battery status by said autonomous compartments cluster to said mobile device within a broadcasted short message while said autonomous compartments cluster is in sleep mode.

17. The method according to claim 16, further comprising: setting said battery status to said usable battery status following on a replacement of said battery pack.

18. The method according to claim 17, further comprising continuing operation of said autonomous compartments cluster without changing said battery status from said usable battery status to said low battery status if said output voltage is determined as higher than said reference minimal voltage.

19. The method according to claim 9, wherein said battery status is set to said usable battery status when said locker module is initially powered, and in that said battery status is changed from said usable battery status to said low battery status when said voltage comparator triggers an alert signal that is a first alert signal since a latest replacement of said battery pack.

* * * * *